US009153484B2

United States Patent
Chen et al.

(10) Patent No.: US 9,153,484 B2
(45) Date of Patent: Oct. 6, 2015

(54) METHODS OF FORMING INTEGRATED CIRCUITS

(71) Applicant: TAIWAN SEMICONDUCTOR MANUFACTURING COMPANY, LTD., Hsinchu (TW)

(72) Inventors: Chii-Ping Chen, Taichung (TW); Dian-Hau Chen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/245,192

(22) Filed: Apr. 4, 2014

(65) Prior Publication Data
US 2014/0220769 A1    Aug. 7, 2014

Related U.S. Application Data

(62) Division of application No. 12/760,732, filed on Apr. 15, 2010, now Pat. No. 8,716,862.

(60) Provisional application No. 61/176,002, filed on May 6, 2009.

(51) Int. Cl.
| H01L 21/4763 | (2006.01) |
| H01L 21/768 | (2006.01) |
| H01L 21/285 | (2006.01) |

(52) U.S. Cl.
CPC .... *H01L 21/76879* (2013.01); *H01L 21/28518* (2013.01); *H01L 21/76816* (2013.01); *H01L 21/76895* (2013.01)

(58) Field of Classification Search
CPC ............ H01L 21/768; H01L 21/28518; H01L 21/76816; H01L 21/76879; H01L 21/76895

USPC .......... 257/741, 774, E23.011; 438/586, 622, 438/637, 675, 687–688
See application file for complete search history.

(56) References Cited

U.S. PATENT DOCUMENTS

| 5,893,734 A | 4/1999 | Jeng et al. |
| 6,022,808 A | 2/2000 | Nogami et al. |
| 6,287,951 B1 * | 9/2001 | Lucas et al. ................... 438/618 |
| 6,555,171 B1 | 4/2003 | Lopatin |

(Continued)

OTHER PUBLICATIONS

Chen, Hsien-Wei et al., "A Self-Aligned Air Gap Interconnect Process", Taiwan Semiconductor Manufacturing Company, Ltd., (TSMC), Hsinchu, Taiwan, R.O.C., 987-1-4244-1911-1-08; 2008, IEEE, pp. 34-36.

*Primary Examiner* — Thanh T Nguyen
(74) *Attorney, Agent, or Firm* — Lowe Hauptman & Ham, LLP

(57) ABSTRACT

A method of forming an integrated circuit comprises forming a gate of a transistor over a substrate. The method further comprises forming a connecting line over the substrate, the connecting line being coupled with an active area of the transistor. The method also comprises forming a dielectric layer surrounding the gate and the connecting line. The method additionally comprises forming an etch stop layer over the dielectric layer and covering a portion of a top surface of the connecting line. The method further comprises forming a via structure comprising a via in physical contact with a top surface of the gate and another portion of the top surface of the connecting line. The method also comprises forming a metallic line structure being coupled with the via structure.

20 Claims, 4 Drawing Sheets

(56) References Cited

U.S. PATENT DOCUMENTS

| | | |
|---|---|---|
| 6,576,543 B2 | 6/2003 | Lin et al. |
| 6,630,393 B2 | 10/2003 | Yamamoto |
| 6,756,309 B1 | 6/2004 | Chen et al. |
| 7,351,628 B2 | 4/2008 | Forbes et al. |
| 7,365,026 B2 | 4/2008 | Jeng et al. |
| 7,803,713 B2 | 9/2010 | Chen et al. |
| 2002/0111016 A1 | 8/2002 | Farquhar et al. |
| 2008/0230917 A1 | 9/2008 | Chou et al. |
| 2009/0108379 A1* | 4/2009 | Oosuka et al. ............... 257/412 |

* cited by examiner

METHODS OF FORMING INTEGRATED CIRCUITS

PRIORITY CLAIM

The present application is a divisional of U.S. application Ser. No. 12/760,732, filed Apr. 15, 2010, which claims priority of U.S. Provisional Application No. 61/176,002, filed May 6, 2009, which are incorporated herein by reference in their entireties.

TECHNICAL FIELD

The present disclosure relates generally to the field of semiconductor devices, and more particularly, to integrated circuits including interlayer dielectric (ILD) structure, systems, and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

As mentioned above, the trend in the semiconductor industry is towards the miniaturization or scaling of integrated circuits, in order to provide smaller ICs and improve performance, such as increased speed and decreased power consumption. While aluminum and aluminum alloys were most frequently used in the past for the material of conductive lines in integrated circuits, the current trend is to use copper for a conductive material because copper has better electrical characteristics than aluminum, such as decreased resistance, higher conductivity, and a higher melting point.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
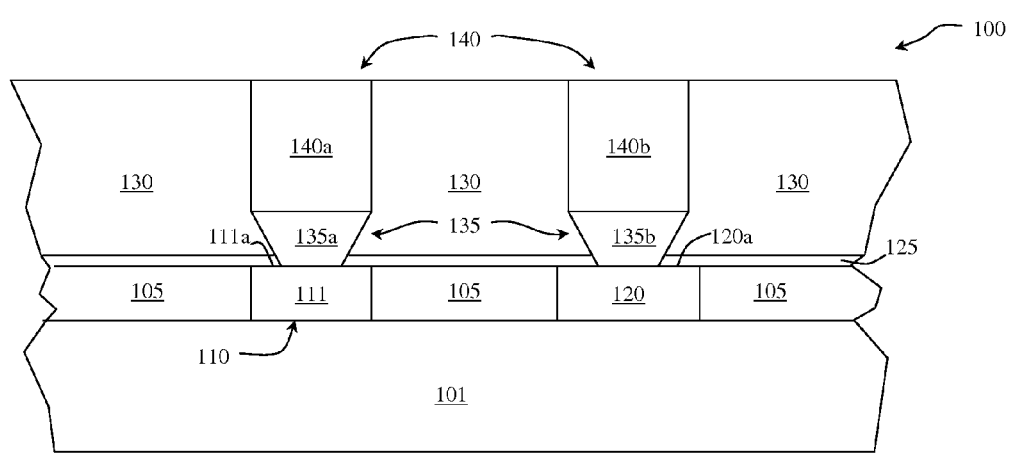
FIG. 1 is a schematic cross-sectional view illustrating an exemplary integrated circuit including a transistor coupled with a metallic line structure.

The CMOS transistor includes a conventional low dielectric constant (low-k) interlayer dielectric (ILD) structure. The conventional ILD structure uses an ILD material around a transistor formed on a substrate. The ILD material can be formed by a high aspect ratio process (HARP). A contact is formed on a gate of the transistor and another contact is formed on an active area of the substrate. Another ILD material formed by a high density plasma chemical vapor deposition (HDP CVD) can be around the contacts. Metal lines are formed on the contacts for an electrical connection.

It is found that a top surface of the gate and a top surface of the substrate have a step height. The step height results in a level difference between the contact disposed on the gate of the transistor and the contact disposed on the active area of the substrate. Due to the level difference, it is difficult to form contact openings to accommodate the contacts that have different depths. For example, if a single etch process is provided to form the contact openings, either the etch process may damage the gate of the transistor or the etch process may not etch a desired thickness of the ILD layers, failing to expose the active area of the substrate.

To solve the issue described above, a double patterning process has been proposed. The double patterning process uses two photoresist masks, two photolithographic processes, and two etch processes to separately define the contact opening for the contact disposed on the gate of the transistor and the contact opening for the contact disposed on the active area of the substrate. The double patterning process increases the cost of manufacturing the integrated circuits and/or makes the manufacturing process complicated.

It is found that the conventional ILD structure uses tungsten (W) plugs disposed within the contact openings for the electrical connection. If the integrated technique shrinks to 22 nm or less, it is found that the resistance of the W plugs jumps up to an undesired level.

It is also found that the conventional ILD structure uses ILD materials formed by a HARP and HDP CVD. The ILD materials have dielectric constants higher than low-k dielectric materials or extreme low-k dielectric materials. Due to the high dielectric constants of the ILD materials, the RC-time delay of the conventional ILD structure is not desired.

From the foregoing, integrated circuits having a low-k ILD structure, systems, and method for forming the integrated circuits are desired.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic cross-sectional view illustrating an exemplary integrated circuit including a transistor coupled with a metallic line structure. In FIG. 1, a transistor 110 can be formed over a substrate 101. The transistor 110 can include a gate 111 and source/drain regions (not shown) adjacent to the gate 111. A connecting line 120 can be disposed over the substrate 101. The connecting line 120 can be coupled with an active area of the transistor 110. A via structure 135 including vias 135a and 135b can be coupled with the gate 111 and the connecting line 120, respectively. A metallic line structure 140 including metallic lines 140a and 140b can be coupled with the via structure 135.

In some embodiments, the substrate 101 can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

The transistor 110 can include at least one gate dielectric layer (not shown). The gate dielectric layer can be a single layer or a multi-layer structure. In some embodiments, the at least one gate dielectric layer can include an interfacial layer, e.g., a silicon oxide layer, and a high-k dielectric layer over the silicon oxide layer. In embodiments using a high-k dielectric layer, the high-k dielectric layer may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The high-k dielectric layer may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

Referring to FIG. 1, the gate 111 can be disposed over the substrate 101. The gate 111 can include at least one semiconductor or conductive material, such as silicon, polysilicon, amorphous silicon, silicon-germanium, metallic material, and/or any combinations thereof. In embodiments using metallic material, the gate 111 can include materials such as metal, metal carbide, metal nitride, or other materials that can provide desired work function for transistors. In embodiments forming an NMOS transistor, the gate 111 can be an n-type metal gate that is capable of providing a work function value of about 4.5 eV or less for the NMOS transistor. In other embodiments forming a PMOS transistor, the gate 111 can be a p-type metal gate layer that is capable of providing a work function value of about 4.8 eV or more for the PMOS transistor. The gate 111 can be formed by any suitable process. For example, the gate 111 may be formed by deposition, photolithography patterning, and etching processes, and/or combinations thereof. The deposition processes may include PVD, CVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof.

The source/drain regions (not shown) of the transistor 110 can be n-type doped regions having dopants such as Arsenic (As), Phosphorus (P), other group V element, or the combinations thereof or p-type doped regions having dopant such as Boron (B) or other group III element. In some embodiments, the source/drain regions can include silicide for low resistances. The silicide may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a Rapid Thermal Processing (RTP). The reacted silicide may require a one step RTP or multiple step RTPs.

In some embodiments, spacers (not shown) can be formed on sidewalls of the gate 111. The spacers can include materials such as oxide, nitride, oxynitride, other dielectric materials, and/or combinations thereof. The formation of the spacers can include forming a dielectric layer over the gate 111 and then etching the dielectric layer to form the spacers.

Referring to FIG. 1, the connecting line 120 can be disposed over the substrate 101. The connecting line 120 can be electrically coupled with the active area (not shown) of the transistor 110. The active area can include a region of the transistor 110 that is capable of providing a channel between the source and the drain of the transistor 110. In embodiments using a planar metal-gate-oxide (MOS) transistor, the active area of the transistor 110 can be disposed within the substrate 101. In other embodiments using a FIN field effect transistor (FIN FET), the active area of the transistor 110 can be disposed in a FIN of the transistor 110. The connecting line 120 can include materials such as tungsten, aluminum, copper, titanium, tantulum, titanium nitride, tantalum nitride, nickel silicide, cobalt silicide, other proper conductive materials, and/or combinations thereof. The connecting line 120 can be formed by any suitable processes, such as deposition, photolithography, and etching processes, and/or combinations thereof. In embodiments, the process for forming the connecting line 120 can be referred to as a M0_OD process. The layer of the connecting line 120 can be referred to as a M0-OD layer. In embodiments using a 22-nm technique, a level difference between a top surface 111a of the gate 111 and a top surface 120a of the connecting line 120 can be about 400 Å or less. In other embodiments, the top surface 111a of the gate 111 can be substantially level with the top surface 120a of the connecting line 120. It is noted that the 400-Å level difference is merely exemplary. One of skill in the art is capable of modifying the level difference to achieve a desired ILD structure.

Referring again to FIG. 1, at least one dielectric layer 105 can be disposed over the substrate 101 and around the gate 111 and the connecting line 120. The dielectric layer 120 may include materials such as oxide, nitride, oxynitride, low-k dielectric material, ultra low-k dielectric material, or any combinations thereof. The dielectric layer 105 may be formed by, for example, a CVD process, a HDP CVD process, a HARP, a spin-coating process, other deposition process, and/or any combinations thereof. In embodiments, the dielectric layer 105 can be referred to as an interlayer dielectric (ILD). In other embodiments, additional dielectric layer (not shown) can be formed below or over the dielectric layer 105 and around the gate 111 and the connecting line 120.

In FIG. 1, an etch stop layer (ESL) 125 can be formed over the dielectric layer 105. The ESL 125 can include materials such as silicon nitride, silicon-carbon based materials such as silicon carbide (SiC) or carbon-doped silicon oxide, carbon-doped oxide, or combinations thereof. The ESL 125 can be formed by plasma enhanced chemical vapor deposition (PECVD), CVD process such as high-density plasma CVD (HDPCVD), atomic layer CVD (ALCVD), or the like.

Referring again to FIG. 1, at least one dielectric layer 130 can be disposed over the ESL 125. The dielectric layer 130 may include materials such as low-k dielectric material, ultra low-k dielectric material, extreme low-k material, or any combinations thereof. The dielectric layer 130 may be formed by, for example, a CVD process or a spin-coating process. In some embodiments, additional dielectric layer (not shown) can be formed below or over the dielectric layer 130 and around the via structure 135 and/or the metallic line structure 140.

As noted, the via structure 135 can include a plurality of vias, e.g., vias 135a and 135b. The vias 135a and 135b can be coupled with the gate 111 and the connecting line 120, respectively. The metallic line structure 140 can include a plurality of metallic lines, e.g., metallic lines 140a and 140b. The metallic lines 140a and 140b can be coupled with the vias 135a and 135b, respectively. In some embodiments, the via structure 135 can be referred to as a single damascene structure. In other embodiments, the via structure 135 and the metallic line structure 140 can be referred to as a dual damascene structure.

The dual damascene structure can be formed by, for example, forming openings (not shown) by means which involves coating and patterning a photoresist layer (not shown) on the dielectric layer 130 and plasma etch transferring the opening through the dielectric layer 130. The remaining photoresist layer can be stripped by an ashing and/or with an application of a liquid stripper. In some embodiments, a diffusion barrier layer (not shown) including materials such as Ta, TaN, Ti, TiN, TaSiN, W, WN, other barrier layer material, and/or combinations thereof can be formed on the sidewalls of the openings by, for example, a CVD process, a PECVD process, or an atomic layer deposition (ALD). The diffusion barrier layer can be formed on the sidewalls and/or bottom of the opening. A following metallic layer including materials such as copper, tungsten, Al, Al/Cu, other conductive material, and/or combinations thereof can be deposited by a CVD, PVD, ALD, electroplating method, and/or other process to fill the openings to form the dual damascene structure. The damascene structure can be achieved by a chemical mechanical polish (CMP) process that can polish the metallic layer, forming the metallic lines 140a and 140b.

It is noted that more ESLs, dielectric layers, via structures, metallic line structures, and/or other semiconductor structure can be formed over the metallic line structure 140 and the dielectric layer 130 to achieve a desired interconnect structure. One of skill in the art can modify processes, materials, and/or mask layers to achieve a desired integrated circuit.

Figure 2:
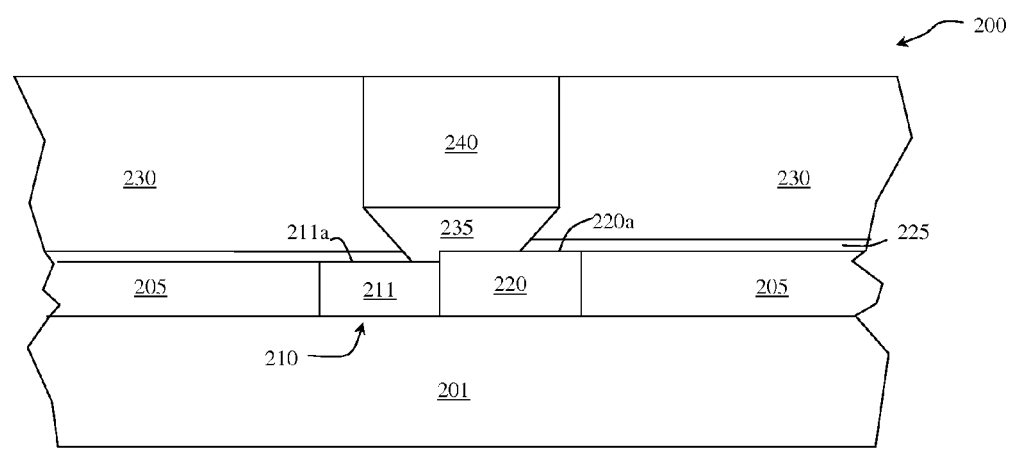
FIG. 2 is a schematic cross-sectional view illustrating another integrated circuit including a butting contact.

FIG. 2 is a schematic cross-sectional view illustrating another integrated circuit including a butting contact. Items of FIG. 2 that are the same items in FIG. 1 are indicated by the same reference numerals, increased by 100. In FIG. 2, the integrated circuit 200 can include the via structure 235 electrically coupling the gate 211 and the connecting line 220. The gate 211 can be adjacent to the connecting line 220. A voltage provided through the via structure 235 can be applied to the gate 211 and the connecting line 220. In some embodiments, a dielectric layer, a barrier layer, and/or other material (not shown) can be disposed between the gate 211 and the connecting line 220.

In some embodiments, the via structure 235 can be referred to as a butting contact. In embodiments using a 22-nm technique, a step height between a top surface 211a of the gate 211 and a top surface 220a of the connecting line 220 can be about 400 Å or less. In other embodiments, the top surface 211a of the gate 211 can be substantially level with the top surface 220a of the connecting line 220.

Figure 3:
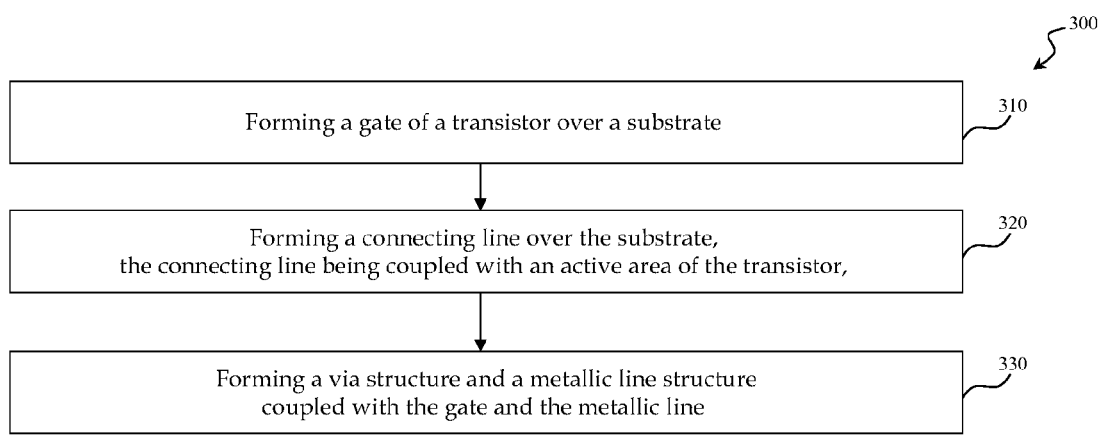
FIG. 3 is a flowchart illustrating an exemplary method for forming an exemplary integrated circuit including a transistor coupled with a metallic line structure.

FIG. 3 is a flowchart illustrating an exemplary method for forming an exemplary integrated circuit including a transistor coupled with a metallic line structure. Referring to FIGS. 1 and 3, a process 300 for forming a metallic line structure, e.g., the metallic line structure 140, coupled with a gate of a transistor, e.g., the gate 111, and a connecting line, e.g., the connecting line 120, can include following steps.

In Step 310, the gate 111 of the transistor 110 can be formed over the substrate 101. In Step 320, the connecting line 120 can be formed over the substrate 101. The connecting line 120 can be coupled with an active area of the transistor 110. In embodiments using a 22-nm technique, a level difference between the top surface 111a of the gate 111 and the top surface 120a of the connecting line 120 can be about 400 Å or less. In other embodiments, the top surface 111a of the gate 111 can be substantially level with the top surface 120a of the connecting line 120. In Step 330, the via structure 135 and the metallic line structure 140 coupled with the gate 111 and the connecting line 120 can be formed. It is noted that the method 300 described above in conjunction with FIG. 3 can be used to form the integrated circuit 200 shown in FIG. 2.

As noted, the conventional ILD structure uses a double-patterning process to define contact openings exposing the top surface of the gate of the transistor and the top surface of the active area of the substrate. The double-patterning process includes two masks, two photolithographic processes, and two etch processes to separately define the contact opening for the W-plug contact disposed on the gate and the contact opening for the W-plug contact disposed on the active area of the substrate.

In contrary to the conventional ILD process, the method 300 described above in conjunction with FIG. 3 forms the gate 111 and the connecting line 120 over the substrate 101. As noted, the top surface 111*a* of the gate 111 can be substantially level with the top surface 120*a* of the connecting line 120. A single via mask, a single photolithographic process, and a single etch process can simultaneously define via holes for the vias 135*a* and 135*b*. While defining the via opening for the via 135*b*, the method 300 can define the via opening for the via 135*a*, substantially free from damaging the gate 111.

As noted, the conventional ILD structure has the W-plug contact disposed between the gate of the transistor and the metal line. Different from the conventional ILD structure, the integrated circuit 100 include the via 135*a* coupled between the gate 111 and the metallic line 140*a*. The via 135*a* can be a single or a portion of a dual damascene structure that uses a conductive material such as copper. The copper via 135*a* can desirably reduce the resistance between the gate 111 and the metallic line 140*a*.

It is noted that the conventional ILD structure includes ILD materials formed by HDP CVD or HARP disposed around the W-plug contacts. Different from the conventional ILD structure, the integrated circuit 100 can include the dielectric material 140 such as ultra low-k material or extreme low-k material disposed around the vias 135*a* and 135*b*. A RC time delay resulting from the vias 135*a* and 135*b* and the dielectric material 140 can be desirably reduced.

It is also found that the integrated circuit 100 uses the connecting line 120 instead of a W-plug contact of the conventional ILD structure. The connecting line 120 can provide a desired resistance for electrical connection between the active area of the transistor 110 and the via 135*b*.

Figure 4:
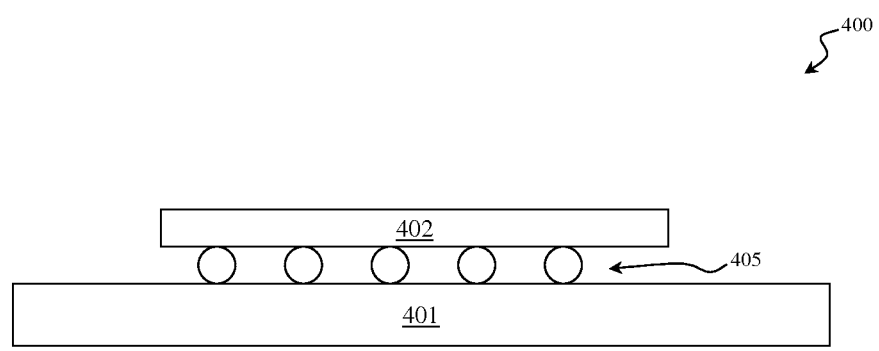
FIG. 4 is a schematic drawing illustrating a system including an exemplary integrated circuit disposed over a substrate board.

FIG. 4 is a schematic drawing illustrating a system including an exemplary integrated circuit disposed over a substrate board. In FIG. 4, a system 400 can include an integrated circuit 402 disposed over substrate board 401. The substrate board 401 can include a printed circuit board (PCB), a printed wiring board and/or other carrier that is capable of carrying an integrated circuit. The integrated circuit 402 can be similar to the integrated circuit 100 or 200 described above in conjunction with FIGS. 1 and 2, respectively. The integrated circuit 402 can be electrically coupled with the substrate board 401. In some embodiments, the integrated circuit 402 can be electrically coupled with the substrate board 401 through bumps 405. In other embodiments, the integrated circuit 402 can be electrically coupled with the substrate board 401 through wire bonding. The system 400 can be part of an electronic system such as computers, wireless communication devices, computer-related peripherals, entertainment devices, or the like.

In some embodiments, the system 400 including the integrated circuit 402 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

An aspect of this description relates to method of forming an integrated circuit. The method comprises forming a gate of a transistor over a substrate. The method further comprises forming a connecting line over the substrate, the connecting line being coupled with an active area of the transistor. The method also comprises forming a dielectric layer surrounding the gate and the connecting line. The method additionally comprises forming an etch stop layer over the dielectric layer and covering a portion of a top surface of the connecting line. The method further comprises forming a via structure comprising a via in physical contact with a top surface of the gate and another portion of the top surface of the connecting line. The method also comprises forming a metallic line structure being coupled with the via structure.

Another aspect of this description relates to a method of forming an integrated circuit. The method comprises forming a gate of a transistor over a substrate. The method also comprises forming a connecting line over the substrate, the connecting line being coupled with an active area of the transistor, a level difference between a top surface of the connecting line and a top surface of the gate being about 400 Å or less. The method further comprises forming a via structure and a metallic line structure being coupled with the gate and the connecting line.

Another aspect of this description relates to a method of forming an integrated circuit. The method comprises forming a transistor having a gate electrode over a substrate, the transistor being formed having an active area embedded in the substrate, and the gate electrode being formed having an upper surface. The method also comprises forming a metallic line over the active area of the transistor, the metallic line being formed to be electrically coupled with the active area of the transistor, and having an upper surface. The method further comprises forming a first dielectric layer over the gate electrode and the metallic line, the first dielectric layer being formed having a first opening at least partially exposing the upper surface of the metallic line and a second opening at least partially exposing the upper surface of the gate electrode. The method additionally comprises forming a second dielectric layer surrounding the gate electrode and the metallic line, the second dielectric layer being formed having an upper surface, the upper surface of the second dielectric layer being formed under the first dielectric layer. The upper surface of the second dielectric layer is formed being substantially level with the upper surface of the gate electrode and the upper surface of the metallic line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
    forming a gate of a transistor over a substrate;
    forming a connecting line over the substrate, the connecting line being coupled with an active area of the transistor;
    forming a dielectric layer surrounding the gate and the connecting line;

forming an etch stop layer over the dielectric layer and covering a portion of a top surface of the connecting line;

forming a via structure comprising a via in physical contact with a top surface of the gate and another portion of the top surface of the connecting line; and forming a metallic line structure being coupled with the via structure.

2. The method of claim 1, wherein the top surface of the connecting line is formed substantially level with the top surface of the gate.

3. The method of claim 1, wherein forming the via structure and the metallic line structure comprises performing a dual damascene process.

4. The method of claim 1, wherein forming the via structure comprises performing a single etch process.

5. The method of claim 1, wherein the gate is formed adjacent to the connecting line.

6. The method of claim 1, wherein forming the gate of the transistor over the substrate comprises forming a metallic gate of the transistor over the substrate.

7. The method of claim 1, wherein forming the connecting line over the substrate comprises forming a tungsten-containing line over the substrate.

8. The method of claim 1, wherein forming the via structure comprises forming a copper via between the gate and the metallic line structure.

9. A method of forming an integrated circuit, the method comprising:

forming a gate of a transistor over a substrate;

forming a connecting line over the substrate, the connecting line being coupled with an active area of the transistor, a level difference between a top surface of the connecting line and a top surface of the gate being about 400 Å or less; and forming a via structure and a metallic line structure being coupled with the gate and the connecting line.

10. The method of claim 9, wherein the top surface of the connecting line is formed substantially level with the top surface of the gate.

11. The method of claim 9, wherein forming the via structure and the metallic line structure comprises performing a dual damascene process.

12. The method of claim 9, wherein the forming the via structure comprises performing a single etch process.

13. The method of claim 9, wherein the gate is formed adjacent to the connecting line.

14. The method of claim 9, wherein forming the gate of the transistor over the substrate comprises forming a metallic gate of the transistor over the substrate.

15. The method of claim 9, wherein forming the connecting line over the substrate comprises forming a tungsten-containing line over the substrate.

16. The method of claim 9, wherein forming the via structure comprises forming a copper via between the gate and the metallic line structure.

17. A method of forming an integrated circuit, the method comprising:

forming a transistor having a gate electrode over a substrate, the transistor being formed having an active area embedded in the substrate, and the gate electrode being formed having an upper surface;

forming a metallic line over the active area of the transistor, the metallic line being formed to be electrically coupled with the active area of the transistor, and having an upper surface;

forming a first dielectric layer over the gate electrode and the metallic line, the first dielectric layer being formed having a first opening at least partially exposing the upper surface of the metallic line and a second opening at least partially exposing the upper surface of the gate electrode; and forming a second dielectric layer surrounding the gate electrode and the metallic line, the second dielectric layer being formed having an upper surface, the upper surface of the second dielectric layer being formed under the first dielectric layer, wherein the upper surface of the second dielectric layer is formed being substantially level with the upper surface of the gate electrode and the upper surface of the metallic line.

18. The method of claim 17, wherein the gate electrode is formed adjacent to the connecting line.

19. The method of claim 17, wherein forming the gate electrode of the transistor over the substrate comprises forming a metallic gate electrode of the transistor over the substrate.

20. The method of claim 17, wherein forming the connecting line over the substrate comprises forming a tungsten-containing line over the substrate.

* * * * *